(12) United States Patent
Kon et al.

(10) Patent No.: US 11,067,761 B2
(45) Date of Patent: Jul. 20, 2021

(54) OPTICAL RECEPTACLE AND OPTICAL MODULE

(71) Applicant: Enplas Corporation, Saitama (JP)

(72) Inventors: Ayano Kon, Saitama (JP); Shimpei Morioka, Saitama (JP)

(73) Assignee: Enplas Corporation, Saitama (JP)

( * ) Notice: Subject to any disclaimer, the term of this patent is extended or adjusted under 35 U.S.C. 154(b) by 0 days.

(21) Appl. No.: 16/646,164

(22) PCT Filed: Sep. 6, 2018

(86) PCT No.: PCT/JP2018/033014
§ 371 (c)(1),
(2) Date: Mar. 11, 2020

(87) PCT Pub. No.: WO2019/049926
PCT Pub. Date: Mar. 14, 2019

(65) Prior Publication Data
US 2020/0271874 A1 Aug. 27, 2020

(30) Foreign Application Priority Data
Sep. 11, 2017 (JP) .............................. JP2017-174145

(51) Int. Cl.
*G02B 6/42* (2006.01)
*G02B 6/43* (2006.01)
*H01S 5/183* (2006.01)

(52) U.S. Cl.
CPC ......... *G02B 6/4214* (2013.01); *G02B 6/4206* (2013.01); *G02B 6/4221* (2013.01);
(Continued)

(58) Field of Classification Search
CPC .. G02B 6/4204; G02B 6/4206; G02B 6/4214; G02B 6/4221; G02B 6/4286;
(Continued)

(56) References Cited

U.S. PATENT DOCUMENTS 10,156,687 B2 * 12/2018 Morioka .............. G02B 6/4286
2014/0133802 A1 5/2014 Morioka
(Continued)

FOREIGN PATENT DOCUMENTS

| JP | 2013-024918 | 2/2013 |
| JP | 2013-061587 | 4/2013 |

(Continued)

OTHER PUBLICATIONS

International Search Report and the Written Opinion Dated Dec. 4, 2018 From the International Searching Authority Re. Application No. PCT/JP2018/033014 and Its Translation of Search Report Into English. (9 Pages).

*Primary Examiner* — Michael P Mooney

(57) ABSTRACT

An optical receptacle has: a first optical surface, a first transmission part, a light separation part, a second optical surface and a third optical surface. The light separation part has a reflection part and a second transmission part. The first transmission part and two or more of a plurality of second transmission parts are present within an optical effectiveness region, where the optical effectiveness region is a region from a central axis to the radius of the larger of the first optical surface and the second optical surface, and the central axis is the optical axis of the light that impinges on the first optical surface and is emitted at the second optical surface.

7 Claims, 15 Drawing Sheets

(52) U.S. Cl.
CPC ............. *G02B 6/4286* (2013.01); *G02B 6/43* (2013.01); *G02B 6/4246* (2013.01); *H01S 5/18361* (2013.01)

(58) Field of Classification Search
CPC ..... G02B 6/4292; G02B 6/43; H01S 5/02325; H01S 5/0683; H01S 5/18361
USPC ................ 385/14, 31, 33, 37, 49, 50, 88–93
See application file for complete search history.

(56) References Cited

U.S. PATENT DOCUMENTS

2017/0356738 A1* 12/2017 Morioka ............... H01L 31/125
2018/0284368 A1   10/2018 Morioka et al.

FOREIGN PATENT DOCUMENTS

| JP | 2013061587 A | * | 4/2013 | ............... G02B 6/42 |
| WO | WO 2016/104302 | | 6/2016 | |
| WO | WO 2017/057035 | | 4/2017 | |
| WO | WO 2019/049926 | | 9/2020 | |

* cited by examiner

OPTICAL RECEPTACLE AND OPTICAL MODULE

TECHNICAL FIELD

The present invention relates to an optical receptacle and an optical module.

BACKGROUND ART

Conventionally, in optical communications using an optical transmission member such as an optical fiber and an optical waveguide, an optical module including a light emitting element such as a surface-emitting laser (e.g. a vertical-cavity surface-emitting laser (VCSEL)) has been used. Such an optical module includes an optical receptacle that operates such that the light containing communication information emitted from a light emitting element is entered into an end surface of the optical transmission member.

In addition, for the purpose of adjusting the light output or stabilizing the output characteristics of a light emitting element against temperature variation, some optical modules include a detection element for checking (monitoring) the intensity and the quantity of the light emitted from the light emitting element.

For example, PTL 1 discloses an optical module including a photoelectric conversion device including a light emitting element and a detection element, and an optical receptacle configured to optically connect the light emitting element and an end surface of an optical transmission member. The optical receptacle includes a first surface configured to allow incidence of light emitted from the light emitting element, a first reflection surface configured to reflect, toward the end surface of the optical transmission member, light entered from the first surface, a transmission part configured to allow, to pass therethrough as signal light travelling toward the end surface of the optical transmission member, a part of light reflected by first reflection surface, a second reflection surface configured to reflect, as monitor light travelling toward the detection element, the remaining part of the light reflected by first reflection surface, a second surface configured to emit the signal light passed through the transmission part such that the light is collected at the end surface of the optical transmission member, and a third lens surface configured to emit, toward the detection element, the monitor light reflected by the second reflection surface.

In the optical module disclosed in PTL 1, the light emitted from the light emitting element is entered from the first surface. A part of the light that is entered from the first surface and is reflected by the first reflection surface passes through the transmission part as signal light, and the remaining part of the light is reflected by the second reflection surface as monitor light. The signal light passed through the transmission part is emitted from the second surface toward the end surface of the optical transmission member. On the other hand, the monitor light reflected by second reflection surface is emitted from the third lens surface toward the light-receiving surface of the detection element.

CITATION LIST

Patent Literature

PTL 1
Japanese Patent Application Laid-Open No. 2013-24918

SUMMARY OF INVENTION

Technical Problem

However, in the optical module disclosed in PTL 1, when the position of the second reflection surface (hereinafter referred to as "reflection part") in the height direction in the optical receptacle is shifted from the intended position even in a small amount (in other words, when the positional accuracy of the reflection part is poor), the light split ratio between the light that passes through the transmission part as signal light and the light that is reflected by the reflection part as monitor light tends to be relatively largely varied. To reduce such variation in the light split ratio, it is desirable to increase the positional accuracy of the reflection part in the optical receptacle as much as possible. However, to achieve such an optical receptacle, the production cost of the metal mold tends to be increased.

To solve the above-mentioned problems, an object of the present invention is to provide an optical receptacle that can reduce variation in light split ratio between signal light and monitor light due to positional displacement of the reflection part in the optical receptacle, and can ease the required positional accuracy of the reflection part. In addition, another object of the present invention is to provide an optical module including the optical receptacle.

Solution to Problem

An optical receptacle according to an embodiment of the present invention is configured to optically couple a light emitting element and an end surface of an optical transmission member when the optical receptacle is disposed between an optical transmission member and a photoelectric conversion device including the light emitting element and a detection element configured to monitor emission light emitted from the light emitting element, the optical receptacle including: a first optical surface configured to allow incidence of the light emitted from the light emitting element; a first transmission part configured to allow, to pass through the first transmission part as signal light travelling toward the end surface of the optical transmission member, a part of light entered from the first optical surface; a light separation part configured to separate another part of the light entered from the first optical surface into monitor light travelling toward the detection element and the signal light travelling toward the end surface of the optical transmission member; a second optical surface configured to emit, toward the end surface of the optical transmission member, the signal light passed through the first transmission part and the signal light separated by the light separation part; and a third optical surface configured to emit, toward the detection element, the monitor light separated by the light separation part. The light separation part includes a reflection part inclined with respect to a light axis of the light entered from the first optical surface, the reflection part being configured to reflect, toward the third optical surface as the monitor light, a part of light incident on the light separation part, a plurality of second transmission parts disposed between the reflection part and the first transmission part, the plurality of second transmission parts being configured to allow, to pass through the plurality of second transmission parts as signal light, another part of the light incident on the light separation part, and the first transmission part and two or more second transmission parts of the plurality of second transmission parts are located within an optical effective region that is a region around a central axis, the central axis being set as a light axis of light that is entered from the first optical surface and is emitted from the second optical surface, the optical effective region having a periphery that is a surface separated from the central axis by a distance equal to one of a radius of the first optical surface and a radius of the second optical surface, the one of the radius of the first optical surface and the radius of the second optical surface being larger than the other.

An optical module according to an embodiment of the present invention includes a photoelectric conversion device including a substrate, a light emitting element disposed on the substrate, and a detection element disposed on the substrate and configured to monitor emission light emitted from the light emitting element; the above-mentioned optical receptacle; and the first transmission part and two or more second transmission parts of the plurality of second transmission parts are located within a light flux of light that is emitted from the light emitting element and is entered from the first optical surface.

Advantageous Effects of Invention

According to the present invention, it is possible to provide an optical receptacle that can reduce variation in light split ratio between signal light and monitor light due to positional displacement of the reflection part in the optical receptacle, and can ease the required positional accuracy of the reflection part.

DESCRIPTION OF EMBODIMENTS

An embodiment of the present invention is elaborated below with reference to the accompanying drawings.

Embodiment 1

Configuration of Optical Module

Figure 1:
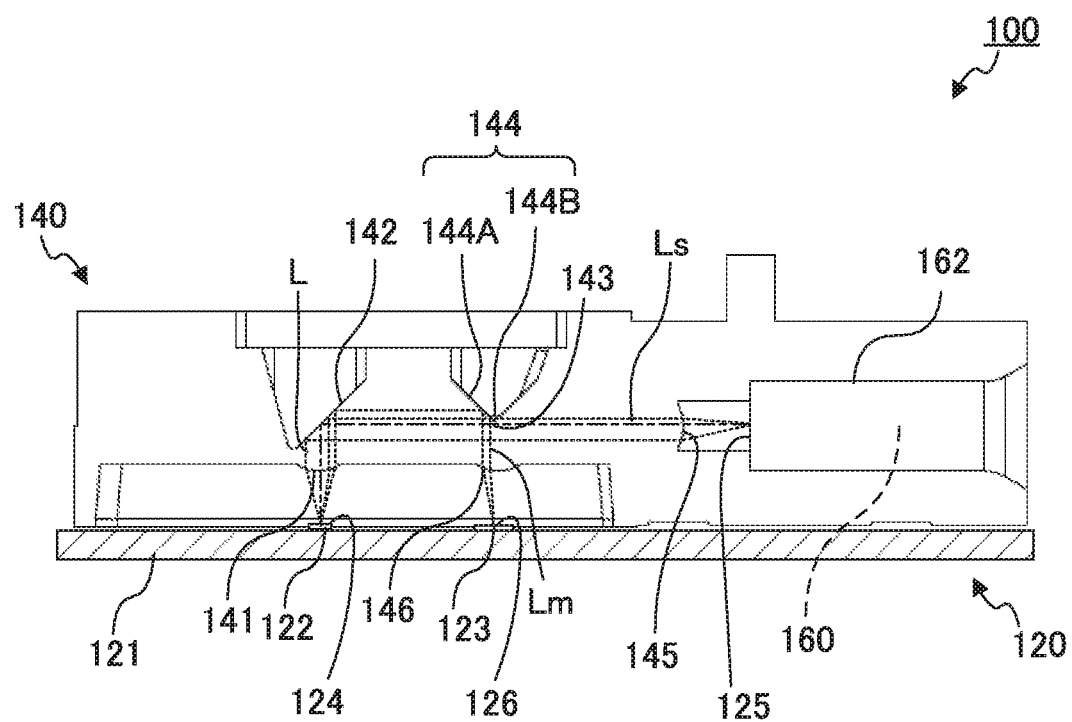
FIG. 1 is a sectional view of an optical module according to Embodiment 1.

FIG. 1 is a sectional view of optical module 100 according to Embodiment 1. FIG. 1 illustrates light paths in optical module 100. Note that, in FIG. 1, the hatching on the cross-section of optical receptacle 140 is omitted to illustrate light paths inside optical receptacle 140.

As illustrated in FIG. 1, optical module 100 includes photoelectric conversion device 120 of a substrate mounting type including light emitting element 122, and optical receptacle 140. Optical module 100 is a transmission optical module, and optical transmission member 160 is coupled (hereinafter also referred to as "connected") to optical receptacle 140 through ferrule 162 when optical module 100 is used. The type of optical transmission member 160 is not limited, and optical transmission member 160 may be an optical fiber, a light waveguide or the like. In the present embodiment, optical transmission member 160 is an optical fiber. The optical fiber may be of a single mode type, or a multiple mode type. The number of optical transmission members 160 is not limited. In the present embodiment, one optical transmission member 160 is provided.

Photoelectric conversion device 120 includes substrate 121, one light emitting element 122, and one detection element 123.

Substrate 121 is a glass composite substrate, a glass epoxy substrate, or a flexible substrate, for example. On substrate 121, light emitting element 122 and detection element 123 are disposed.

Light emitting element 122 is disposed on substrate 121, and emits laser light in a direction perpendicular to the installation part of substrate 121 where light emitting element 122 is disposed. The number of light emitting elements 122 is not limited. In the present embodiment, one light emitting element 122 is provided. Also, the position of light emitting element 122 is not limited. Light emitting element 122 is a vertical-cavity surface-emitting laser (VCSEL), for example.

Detection element 123 receives monitor light Lm for monitoring the output (e.g., the intensity and the quantity) of emission light L emitted from light emitting element 122. Detection element 123 is a photodetector, for example. The number of detection element 123 is not limited. In the present embodiment, one detection element 123 are provided. In addition, for the purpose of preventing reentrance, into optical receptacle 140, of the light reflected by detection element 123, the light axis of monitor light Lm that enters detection element 123 may be tilted with respect to detection surface 126 of detection element 123.

Optical receptacle 140 is disposed on substrate 121 of photoelectric conversion device 120. In the state where optical receptacle 140 is disposed between photoelectric conversion device 120 and optical transmission member 160, optical receptacle 140 optically couples (hereinafter also referred to as "connects") light emitting surface 124 of light emitting element 122 and end surface 125 of optical transmission member 160. A configuration of optical receptacle 140 is elaborated below.

Configuration of Optical Receptacle

Figure 2A:
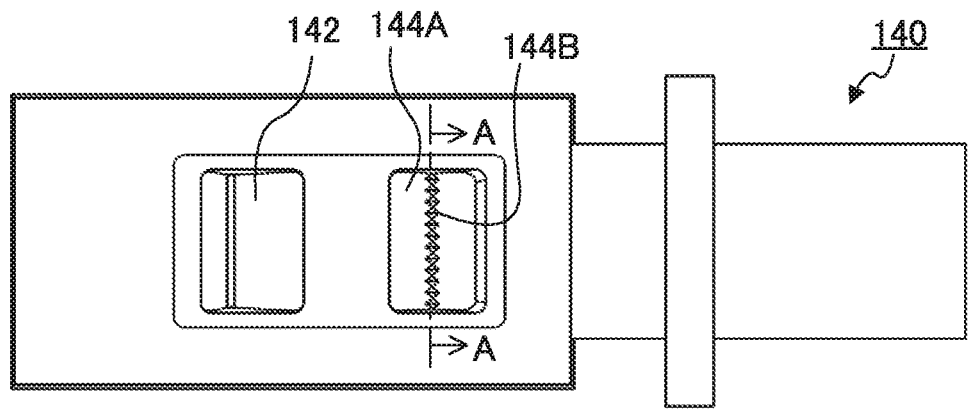
FIGS. 2A to 2C illustrate a configuration of an optical receptacle according to Embodiment 1.
Figure 2B:
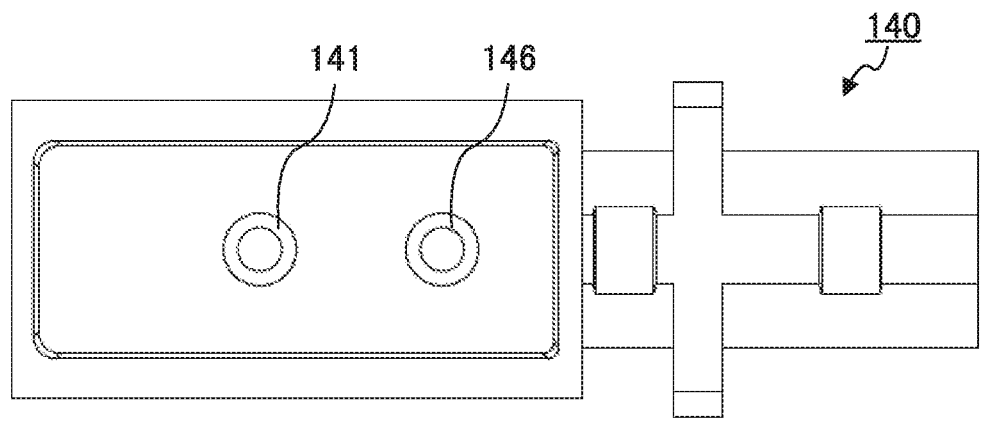
Figure 2C:
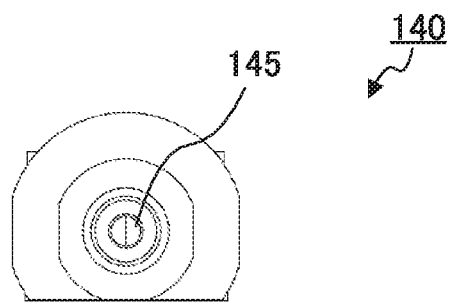
Figure 3:
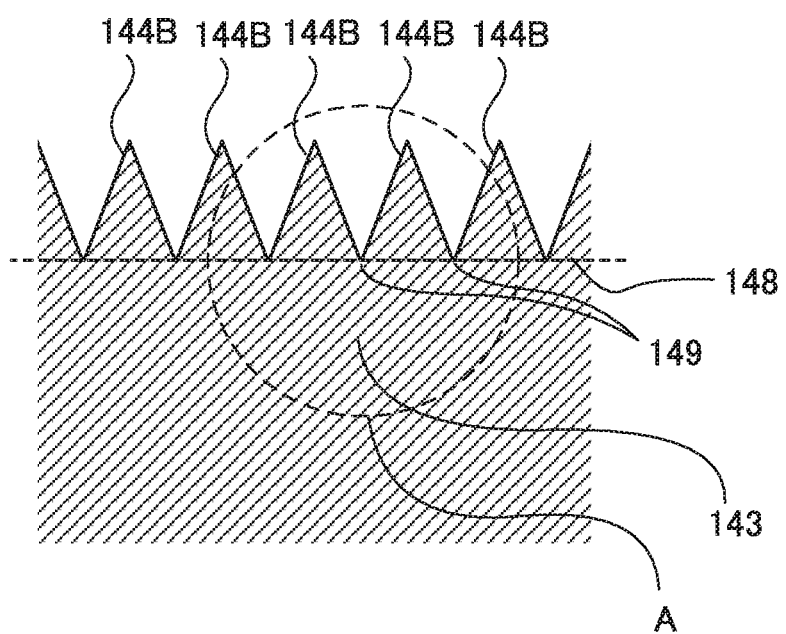
FIG. 3 is a partially enlarged sectional view of a main part in a cross section taken along line A-A of FIG. 2A.
Figure 4:
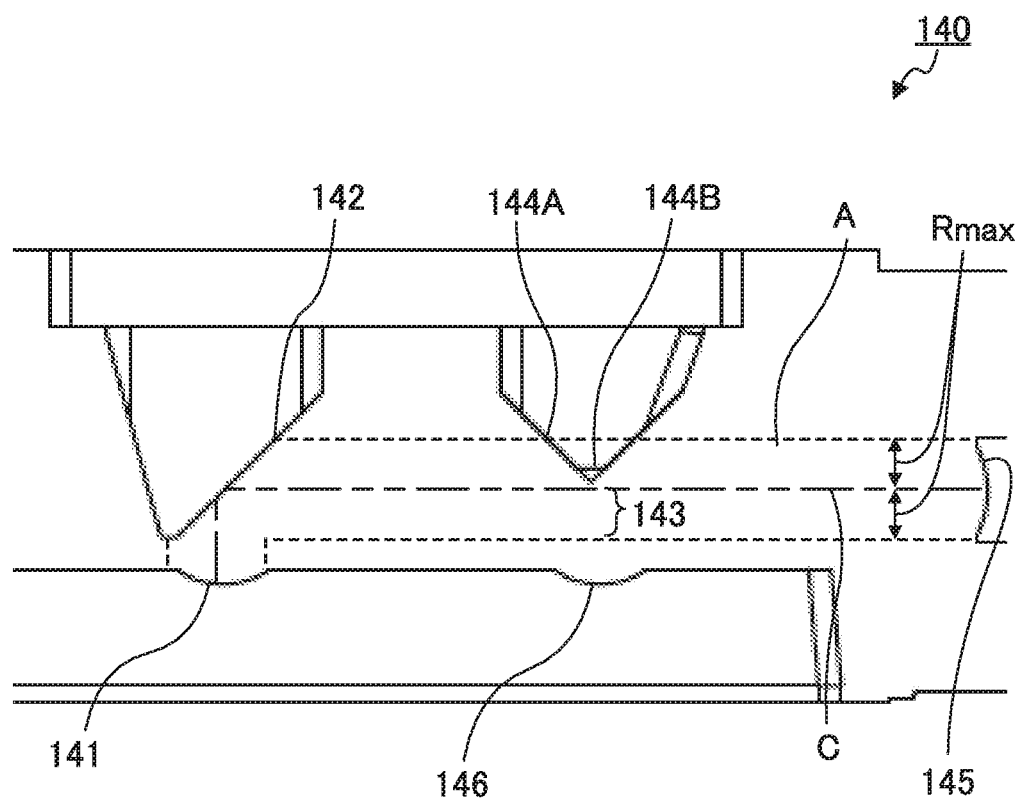
FIG. 4 is a partially enlarged sectional view illustrating a configuration of the optical receptacle according to Embodiment 1.

FIGS. 2A to 4 illustrate a configuration of optical receptacle 140 according to the present embodiment. FIG. 2A is a plan view of optical receptacle 140, FIG. 2B is a bottom view of optical receptacle 140, and FIG. 2C is a front view of optical receptacle 140. FIG. 3 is a partially enlarged sectional view of a main part taken along line A-A of FIG. 2A. FIG. 4 is a partially enlarged sectional view illustrating a configuration of optical receptacle 140 according to the present embodiment.

As illustrated in FIGS. 2A to 4, optical receptacle 140 is optically transparent. Optical receptacle 140 emits toward end surface 125 of optical transmission member 160 a part of emission light L emitted from light emitting surface 124 of light emitting element 122 as signal light Ls, and emits the other part of the light toward detection element 123 as monitor light Lm. Optical receptacle 140 includes first optical surface 141, reflection surface 142, first transmission part 143, light separation part 144, second optical surface 145, and third optical surface 146. Light separation part 144 includes reflection part 144A and a plurality of second transmission parts 144B. In the present embodiment, one first optical surface 141, one first transmission part 143, one reflection part 144A, one second optical surface 145 and one third optical surface 146 are provided.

Optical receptacle 140 is formed using a material having a transparency to light of the wavelength used in optical communications. Examples of such a material include transparent resins such as polyetherimide (PEI) and cyclic olefin resin. In addition, for example, optical receptacle 140 is manufactured by injection molding.

First optical surface 141 is an optical surface that allows emission light L emitted from light emitting element 122 to enter optical receptacle 140 while refracting emission light L. First optical surface 141 may convert emission light L emitted from light emitting element 122 into collimated light, converge light, or diffusion light. In the present embodiment, first optical surface 141 converts emission light L emitted from light emitting element 122 into collimated light. In the present embodiment, first optical surface 141 has a shape of a convex lens protruding toward light emitting element 122. In addition, first optical surface 141 has a circular shape in plan view. Preferably, the central axis of first optical surface 141 is perpendicular to light emitting surface 124 of light emitting element 122. In addition, preferably, the central axis of first optical surface 141 is aligned with the light axis of emission light L emitted from light emitting element 122.

Reflection surface 142 is an inclined surface formed on the top surface side of optical receptacle 140, and is disposed on the light path between first optical surface 141 and first transmission part 143 and on the light path between first optical surface 141 and light separation part 144. Reflection surface 142 reflects, toward first transmission part 143 and light separation part 144, light entered from first optical surface 141 (emission light L emitted from light emitting element 122). Reflection surface 142 is tilted such that it comes closer to second optical surface 145 (optical transmission member 160) in the direction from the bottom surface toward the top surface of optical receptacle 140. In the present embodiment, the inclination angle of reflection surface 142 is 45 degrees with respect to the light axis of emission light L entered from first optical surface 141. Emission light L entered from first optical surface 141 internally impinges on reflection surface 142 at an incident angle greater than the critical angle. In this manner, reflection surface 142 totally reflects incident emission light L in the direction along the surface of substrate 121.

First transmission part 143 is a region that allows to pass therethrough a part of the light entered from first optical surface 141, as signal light Ls travelling toward end surface 125 of optical transmission member 160. First transmission part 143 is disposed such that first transmission part 143 is in contact with the plurality of second transmission parts 144B of light separation part 144.

Light separation part 144 separates the other part (preferably, the remaining part) of the light entered from first optical surface 141 into monitor light Lm travelling toward third optical surface 146 (or detection element 123), and signal light Ls travelling toward second optical surface 145 (or end surface 125 of optical transmission member 160). Light separation part 144 includes reflection part 144A and the plurality of second transmission parts 144B.

Reflection part 144A is disposed on the top surface side of optical receptacle 140. Reflection part 144A is tilted with respect to the light axis of the light entered from first optical surface 141, and reflects, toward third optical surface 146, a part of light incident on light separation part 144. In the present embodiment, reflection part 144A is an inclined surface that is tilted such that it comes closer to second optical surface 145 (optical transmission member 160) in the direction from the top surface toward the bottom surface optical receptacle 140. The inclination angle of the inclined surface is 45° with respect to the light axis of the light entered from first optical surface 141.

The plurality of second transmission parts 144B are disposed between reflection part 144A and first transmission part 143, and the plurality of second transmission parts 144B allow, to pass therethrough as signal light Ls, at least a part of the other part of the light incident on light separation part 144 (preferably, the other part of the light that is not the light reflected by reflection part 144A). Preferably, the plurality of second transmission parts 144B is in contact with first transmission part 143.

Boundary 148 between second transmission part 144B and first transmission part 143 is set such that the plurality of second transmission parts 144B are formed for one first transmission part 143 (see FIG. 3). Specifically, boundary 148 between second transmission part 144B and first transmission part 143 is a line or a plane that connects valley parts 149 (lowermost portions in the height direction) of the plurality of second transmission parts 144B. In the present embodiment, boundary 148 between second transmission part 144B and first transmission part 143 is located at or near the light axis of the light entered from first optical surface 141 (see FIG. 8).

First transmission part 143 and two or more second transmission parts 144B are located within optical effective region A (see FIGS. 3 and 4). Optical effective region A is a region around central axis C, which is set as the light axis of light that is entered from first optical surface 141 and is emitted from second optical surface 145. The periphery of optical effective region A is a surface separated from central axis C by a distance equal to radius Rmax, which is the radius of one of first optical surface 141 and second optical surface 145 larger than the other. In the present embodiment, optical effective region A is a columnar region whose periphery is a surface that is separated from central axis C by a distance equal to the radius of second optical surface 145. Thus, first transmission part 143 and two or more second transmission parts 144B can be set within the light flux of the light that is entered from first optical surface 141 and is emitted from second optical surface 145 (see FIG. 1).

Preferably, the number of second transmission parts 144B included in optical effective region A is 2 to 20, more preferably 2 to 10 or more from a view point of reducing variation in light split ratio due to positional displacement of light separation part 144 although it depends on the cross-sectional area of second transmission part 144B and/or the required light split ratio.

The plurality of second transmission parts 144B may be disposed next to each other, or may be disposed with a space therebetween. In the present embodiment, from a viewpoint of reducing variation in light split ratio due to the positional accuracy of light separation part 144 or the like, the plurality of second transmission parts 144B are disposed next to each other.

Typically, the closer the light emitted from light emitting element 122 is to the light axis, the greater the intensity of the light. Therefore, when the position of light separation part 144 in the height direction is shifted even in a small amount in a region around the light axis, the light split ratio of monitor light Lm and signal light Ls tends to be relatively largely varied. Accordingly, preferably, the width of second transmission part 144B is at least equal to or greater than a predetermined length, such as 50% or more of the length of boundary 148 in a region around boundary 148 located in a region around the light axis of light L entered from first optical surface 141 in the cross-section perpendicular to the light axis of light L entered from first optical surface 141 (or, the cross-section perpendicular to the light axis of light reflected by reflection surface 142) from a viewpoint of reducing variation in light split ratio due to the positional accuracy of light separation part 144. In addition, preferably, the width of second transmission part 144B is constant or increased in the direction toward first transmission part 143 in the cross-section perpendicular to the light axis of light L entered from first optical surface 141. The width of second transmission part 144B is the length of the extending direction of boundary 148 between first transmission part 143 and second transmission part 144B, or in other words, the length in the direction perpendicular to the height direction in the cross-section perpendicular to the light axis of light L entered from first optical surface 141. The height direction is a direction connecting the bottom surface and the top surface of optical receptacle 140, and is a direction perpendicular to the light axis of light passing through first transmission part 143 or second transmission part 144B.

The cross-sectional shape of second transmission part 144B in the cross-section perpendicular to the light axis of light L entered from first optical surface 141 may be, but not limited to, a polygonal shape or an arch shape. Examples of the polygonal shape include a triangular shape, a rectangular shape, and a trapezoidal shape. Examples of the arch shape, which is a shape with a straight line connecting both ends of an arc or an elliptical arc, include a semicircular shape.

From a viewpoint of reducing variation in light split ratio due to the positional accuracy of light separation part 144, the width of second transmission part 144B preferably increases in the direction toward first transmission part 143 in the cross-section perpendicular to the light axis of light L entered from first optical surface 141. In the present embodiment, the cross-sectional shape of second transmission part 144B is a triangular shape with boundary 148 as the bottom side (see FIG. 3).

As described above, in the cross-section perpendicular to the light axis of light L entered from first optical surface 141, the sum of cross-sectional areas of two or more second transmission parts 144B included in optical effective region A is smaller than the cross-sectional area of optical effective region A. To be more specific, preferably, the sum of cross-sectional areas of two or more second transmission parts 144B included in optical effective region A is 30 to 86%, more preferably, 40 to 76% of the cross-sectional area of optical effective region A. When the sum of cross-sectional areas of two or more second transmission parts 144B is 30% or greater, it is possible to further reduce variation in light split ratio due to the positional shift of light separation part 144 (or reflection part 144A) in the height direction. When the sum of cross-sectional areas of two or more second transmission parts 144B is 86% or smaller, it is possible to reduce excessive reduction of light reflected at reflection part 144A as monitor light Lm.

In the present embodiment, as described above, a part of light L entered from first optical surface 141 passes through first transmission part 143 and becomes signal light Ls travelling toward end surface 125 of optical transmission member 160. The other part (preferably, the remaining part) of the light entered from first optical surface 141 impinges on light separation part 144, and a part of the light is reflected by reflection part 144A and becomes monitor light Lm travelling toward the detection element, and at least a part of light other than the light reflected by reflection part 144A (preferably, light other than the light reflected by reflection part 144A) passes through second transmission part 144B and becomes signal light Ls travelling toward end surface 125 of optical transmission member 160.

The light quantity ratio between signal light Ls and monitor light Lm is not limited as long as monitor light Lm that enables monitoring of the intensity and quantity of emission light L emitted from light emitting element 122 can be obtained while obtaining a desired quantity of light signal light Ls. In the present embodiment, signal light Ls is the sum of signal light that has passed through first transmission part 143, and signal light that has passed through second transmission part 144B. Preferably, the light quantity ratio between signal light Ls and monitor light Lm is signal light Ls:monitor light Lm=6:4 to 8:2. More preferably, the light quantity ratio between signal light Ls and monitor light Lm is signal light Ls:monitor light Lm=7:3.

In addition, in the present embodiment, second transmission part 144B is disposed such that signal light Ls passed therethrough is emitted out of optical receptacle 140 for the first time from second optical surface 145 (see FIG. 1). That is, second transmission part 144B does not include a transmission surface, on the light path between first optical surface 141 and second optical surface 145, that emits light passed through second transmission part 144B out of optical receptacle 140.

Second optical surface 145 is an optical surface that emits, toward end surface 125 of optical transmission member 160, signal light Ls passed through first transmission part 143 and signal light Ls separated by light separation part 144. In the present embodiment, second optical surface 145 is disposed to face end surface 125 of optical transmission member 160 in the front surface of optical receptacle 140. Second optical surface 145 has a shape of a convex lens protruding toward end surface 125 of optical transmission member 160. With this configuration, signal light Ls that has been separated by light separation part 144 and signal light Ls that has passed through first transmission part 143 after entry from first optical surface 141 can be collected and efficiently coupled to end surface 125 of optical transmission member 160.

Third optical surface 146 is disposed on the bottom surface side of optical receptacle 140 in such a manner as to face detection element 123. In the present embodiment, third optical surface 146 is a convex lens surface protruding toward detection device 123. Third optical surface 146 collects monitor light Lm separated by reflection part 144A of light separation part 144 and emits the light toward detection element 123. In this manner, it is possible to efficiently couple monitor light Lm to detection element 123. Preferably, the central axis of third optical surface 146 is perpendicular to the light reception surface (substrate 121) of detection element 123.

Operation

An operation of optical module 100 according to the present embodiment is described below in comparison with a comparative optical module.

Figure 5:
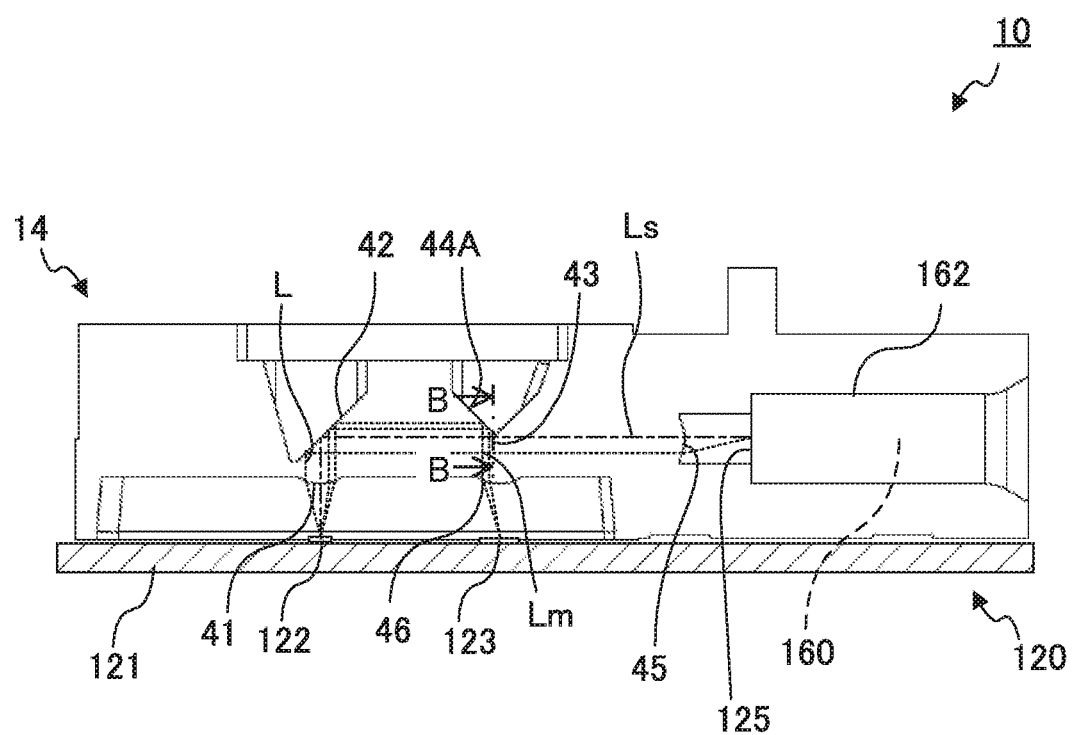
FIG. 5 is a sectional view of a comparative optical module.
Figure 6:
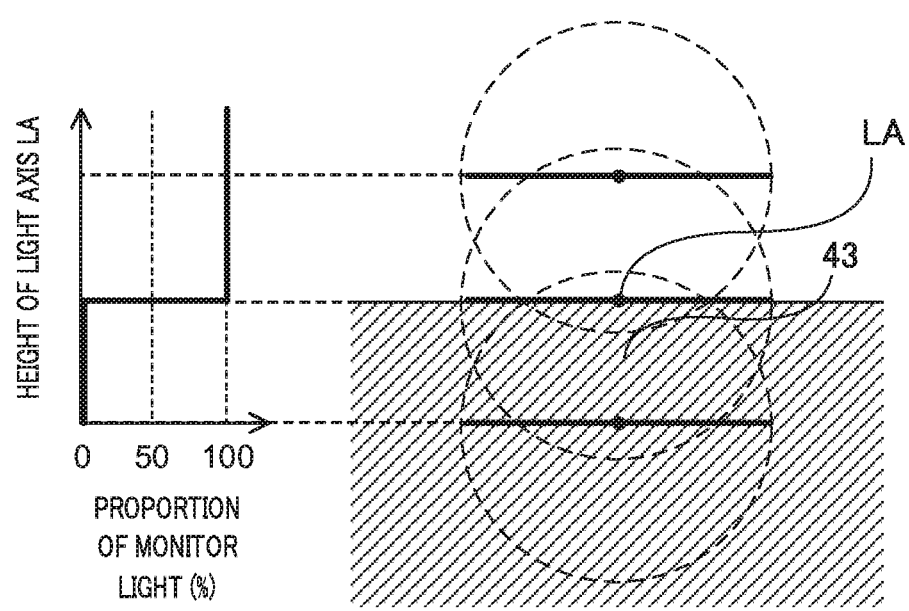
FIG. 6 is a sectional view illustrating a positional relationship between a first transmission part and light at the same height as a light axis of light entered from a first optical surface in a cross section taken along line B-B of FIG. 5.
Figure 7:
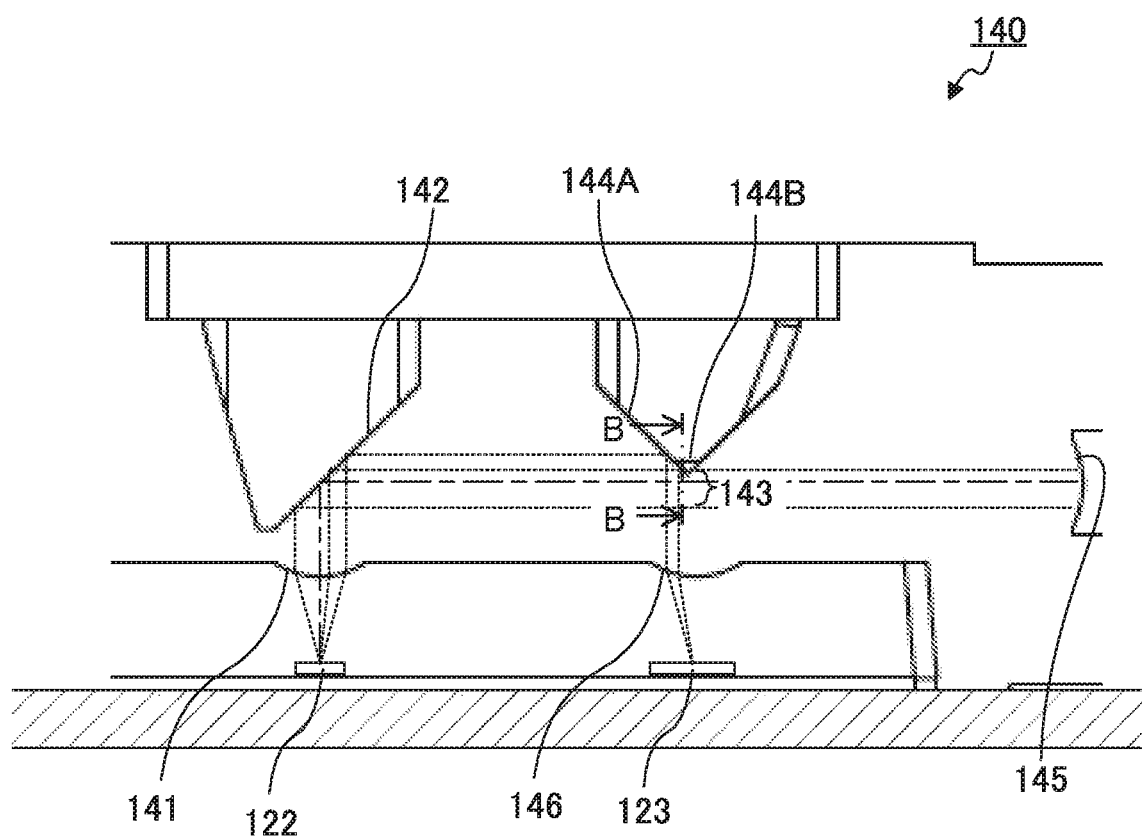
FIG. 7 is a partially enlarged sectional view of a region around a light separation part of FIG. 1.
Figure 8:
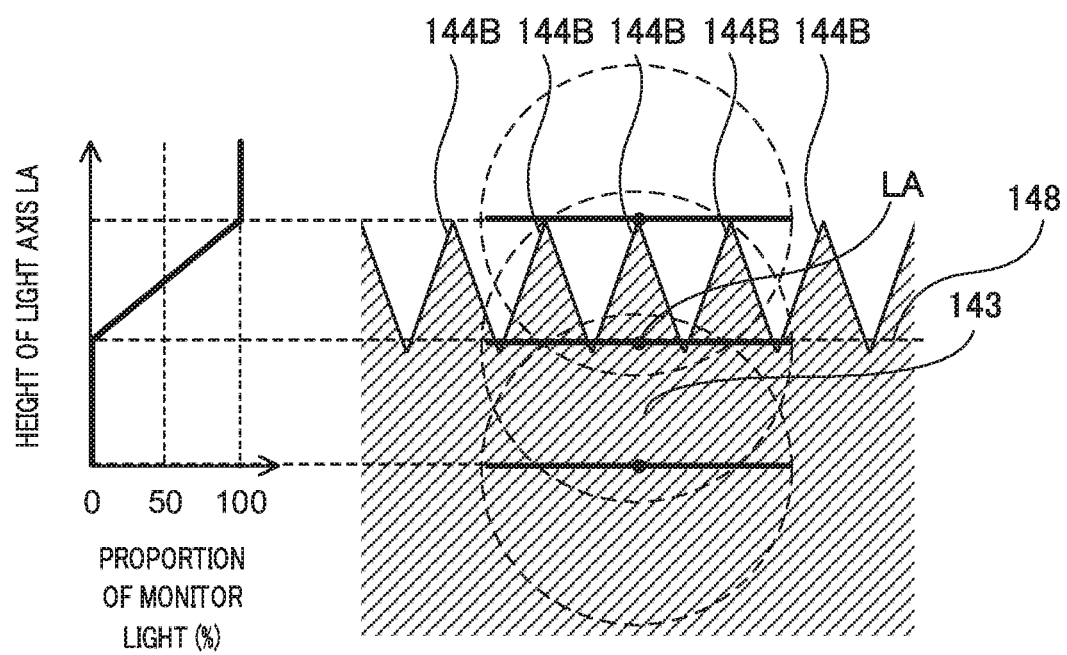
FIG. 8 is a sectional view illustrating a positional relationship between light at the same height as the light axis of the light entered from the first optical surface, the first transmission part and a plurality of second transmission parts in a cross-section taken along line B-B of FIG. 7.

FIG. 5 is a sectional view illustrating a configuration of comparative optical module 10. Comparative optical module 10 has the same configuration as optical module 100 according to the present embodiment except that optical receptacle 14 does not include the second transmission part. FIG. 6 is a cross-sectional view taken along line B-B of FIG. 5, and illustrates a positional relationship between first transmission part 43 and light at the same height as light axis LA of light entered from first optical surface 41. FIG. 7 is a partially enlarged sectional view of a region around light separation part 144 illustrated in FIG. 1. FIG. 8 is a cross-sectional view taken along line B-B of FIG. 7, and illustrates a positional relationship between light at the same height as light axis LA of the light entered from first optical surface 141, first transmission part 143 and the plurality of second transmission parts 144B. In FIGS. 6 and 8, light axis LA is illustrated as a black circle, light at the same height as light axis LA is illustrated with a black line, and the periphery of the light flux is illustrated with a broken line. In addition, in FIGS. 6 and 8, the graph on the left side illustrates a relationship between the height of light axis LA, and the proportion of light at the same height as light axis LA that becomes monitor light Lm.

As illustrated in FIG. 5, in comparative optical module 10, emission light L emitted from light emitting element 122 enters optical receptacle 14 from first optical surface 41. A part of light that is entered from first optical surface 41 and then reflected by reflection surface 42 passes through first transmission part 43 and becomes signal light Ls travelling toward optical transmission member 160, and the other part (preferably, the remaining part) of that light is reflected by reflection part 44A and becomes monitor light Lm travelling toward detection element 123. Signal light Ls that passes through first transmission part 43 toward optical transmission member 160 is emitted from second optical surface 45 so as to reach end surface 125 of optical transmission member 160. On the other hand, monitor light Lm travelling toward detection element 123 is emitted from third optical surface 46 and reaches detection element 123.

As illustrated in FIG. 6, in the above-mentioned comparative optical module 10, when light axis LA of light entered from first optical surface 41 is located in first transmission part 43, the entirety of the light at the same height as light axis LA passes through first transmission part 43, and accordingly the proportion of monitor light Lm with respect to the light at the same height as light axis LA is 0%. On the other hand, when light axis LA is located on the upper side of the boundary between first transmission part 43 and reflection part 44A even in a small amount, the entirety of the light at the same height as light axis LA is reflected by reflection part 44A (see FIG. 5), and accordingly the proportion of monitor light Lm with respect to the light at the same height as light axis LA is 100%. In other words, as the position of light axis LA is shifted upward with respect to the boundary between first transmission part 43 and reflection part 44A, the proportion of monitor light Lm with respect to the light at the same height as light axis LA discontinuously (abruptly) increases from 0% to 100%.

Accordingly, when the position of the light entered from first optical surface 41 is shifted upward with respect to the set position even in a small amount due to positional displacement of reflection part 44A in optical receptacle 14, monitor light Lm tends to be abruptly increased, and the intensity of signal light Ls tends to be abruptly reduced. Consequently, variation in light split ratio between signal light Ls that passes through first transmission part 43 and monitor light Lm that is reflected by reflection part 44A is relatively large.

In contrast, in optical module 100 according to the present embodiment, emission light L emitted from light emitting element 122 enters optical receptacle 140 from first optical surface 141 as illustrated in FIGS. 1 and 7. A part of the light that is entered from first optical surface 141 and then reflected by reflection surface 142 passes through first transmission part 143 and becomes signal light Ls travelling toward optical transmission member 160, and the other part (preferably, the remaining part) of that light impinges on light separation part 144. A part of the light that impinges on light separation part 144 is reflected by reflection part 144A and becomes monitor light Lm travelling toward detection element 123, and at least a part of light other than the light reflected by reflection part 144A (preferably, light other than the light reflected by reflection part 144A) passes through second transmission part 144B and becomes signal light Ls travelling toward optical transmission member 160. Signal light Ls passed through first transmission part 143 and signal light Ls passed through second transmission part 144B is emitted from second optical surface 145 so as to reach end surface 125 of optical transmission member 160. On the other hand, monitor light Lm travelling toward detection element 123 is emitted from third optical surface 146 so as to reach detection element 123.

As illustrated in FIG. 8, in such an optical module 100 according to the present embodiment, when light axis LA of the light entered from first optical surface 141 is located in first transmission part 143, the entirety of the light at the same height as light axis LA passes through first transmission part 143, and accordingly the proportion of monitor light Lm with respect to the light at the same height as light axis LA is 0%. On the other hand, as the position of light axis LA is shifted upward with respect to boundary 148 between first transmission part 143 and second transmission part 144B, the proportion of the light at the same height as light axis LA that is reflected by reflection part 144A increases (see FIG. 7) and the proportion of the light that passes through second transmission part 144B decreases, and accordingly, the proportion of monitor light Lm with respect to the light at the same height as light axis LA gradually increases. Then, when light axis LA is located at the vertex of second transmission part 144B, the entirety of the light at the same height as light axis LA is reflected by reflection part 144A (see FIG. 7), and accordingly the proportion of monitor light Lm with respect to the light at the same height as light axis LA is 100%. That is, as the position of light axis LA is shifted upward with respect to boundary 148 between first transmission part 143 and second transmission part 144B, the proportion of monitor light Lm with respect to the light at the same height as light axis LA continuously (gently) increases from 0% to 100%.

Accordingly, even when the position of the light that impinges on first optical surface 141 is shifted upward with respect to the set position due to positional displacement of light separation part 144 in optical receptacle 140, the intensity of monitor light Lm tends to be gently increased, and the intensity of signal light Ls tends to be gently reduced. Thus, variation in the light split ratio between signal light Ls and monitor light Lm can be suppressed.

Effect

As described above, optical module 100 according to the present embodiment further includes the plurality of second transmission parts 144B in addition to first transmission part 143. Thus, even when the position of light separation part 144 in optical receptacle 140 is shifted, variation in the light split ratio between monitor light Lm and signal light Ls can be suppressed. Thus, the required positional accuracy of light separation part 144 in optical receptacle 140 can be eased.

Embodiment 2

Configuration of Optical Module

Optical module 200 according to Embodiment 2 differs from optical module 100 according to Embodiment 1 in the configuration of optical receptacle 240. Specifically, optical receptacle 240 according to the present embodiment differs from optical receptacle 140 according to Embodiment 1 in the shape of second transmission part 244B, and fourth optical surface 147, which is further provided in optical receptacle 240. Therefore, only second transmission part 244B and fourth optical surface 147 are described below, and the components similar to those of Embodiment 1 are designated with the same reference numerals, and the description thereof is omitted.

Figure 9:
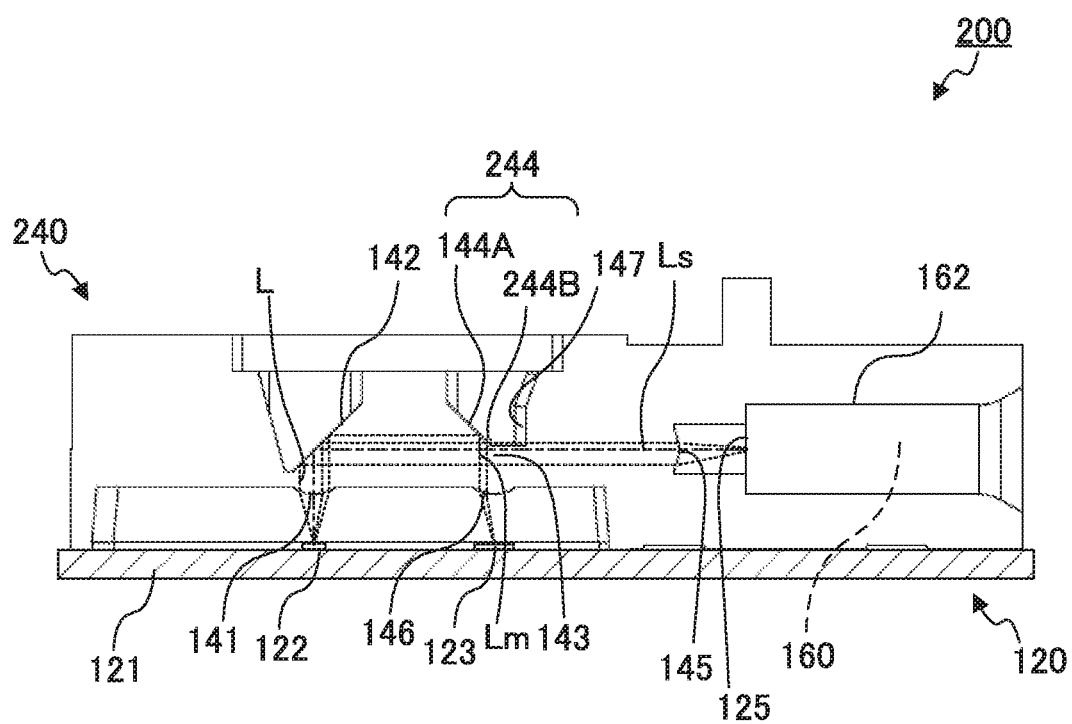
FIG. 9 is a sectional view of an optical module according to Embodiment 2.

FIG. 9 is a sectional view of optical module 200 according to Embodiment 2. FIG. 9 illustrates light paths of optical module 200. Note that, in FIG. 9, the hatching on the cross-section of optical receptacle 240 is omitted to illustrate light paths in optical receptacle 240.

As illustrated in FIG. 9, optical module 200 includes optical receptacle 240 and photoelectric conversion device 120 of a substrate mounting type including light emitting element 122.

Configuration of Optical Receptacle

Figure 10A:
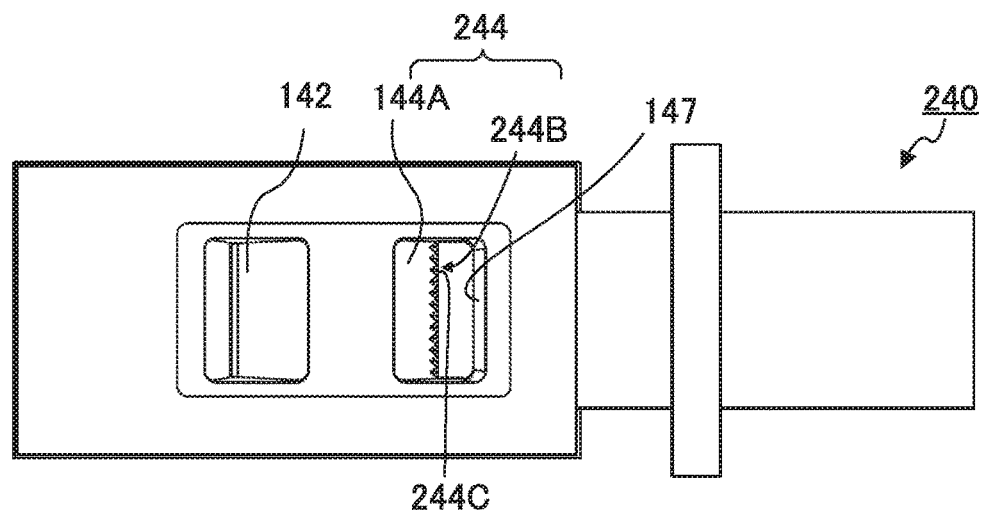
FIGS. 10A to 10C illustrate a configuration of an optical receptacle according to Embodiment 2.
Figure 10B:
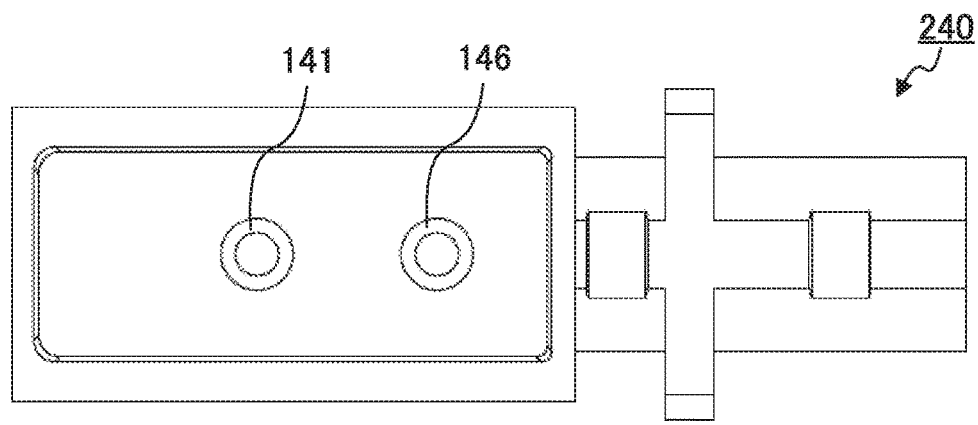
Figure 10C:
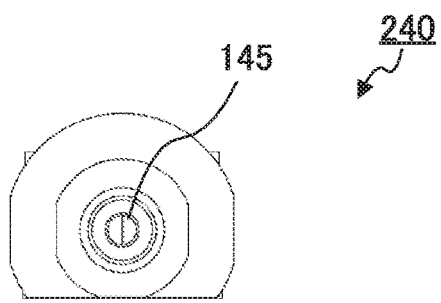
Figure 11:
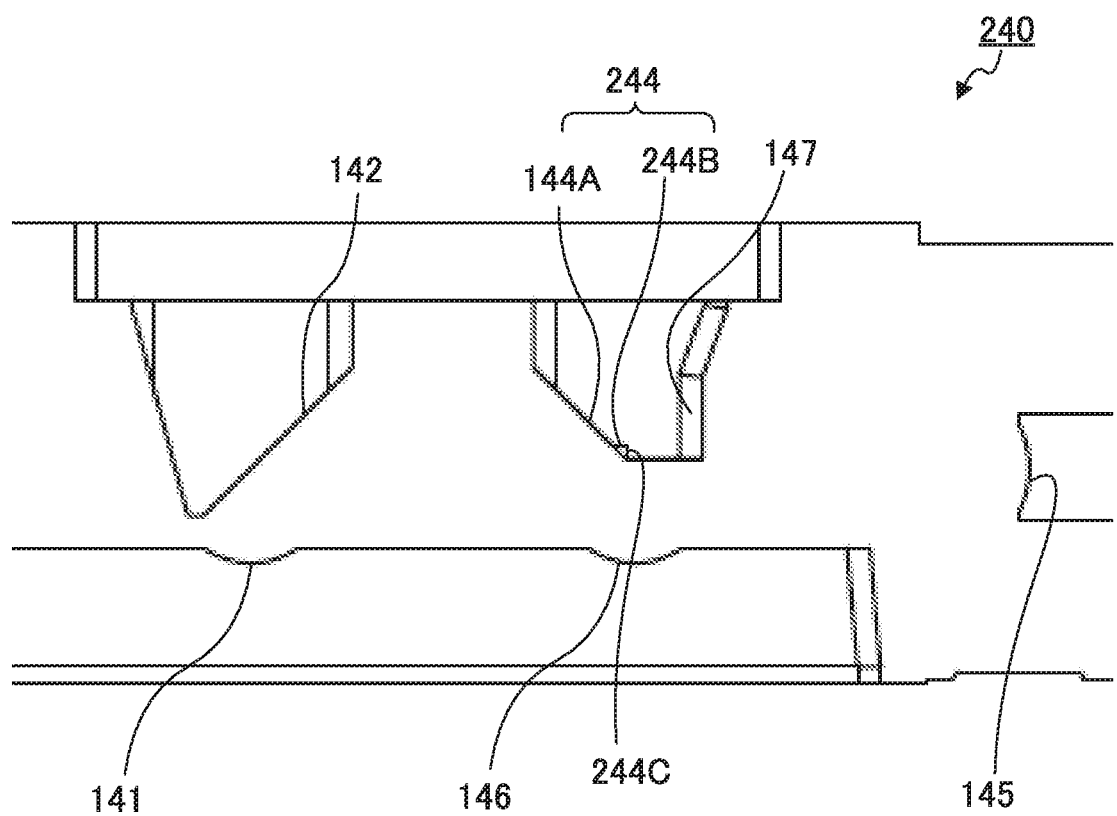
FIG. 11 is a partially enlarged sectional view illustrating a configuration of the optical receptacle according to Embodiment 2.

FIGS. 10A to 11 illustrate a configuration of optical receptacle 240 according to the present embodiment. FIG. 10A is a plan view of optical receptacle 240, FIG. 10B is a bottom view of optical receptacle 240, and FIG. 10C is a front view of optical receptacle 240. FIG. 11 is a partially enlarged sectional view illustrating a configuration of optical receptacle 240 according to the present embodiment.

As illustrated in FIGS. 10A to 11, optical receptacle 240 is identical to optical receptacle 140 according to Embodiment 1 illustrated in FIG. 1 except for the shape of a plurality of second transmission parts 244B of light separation part 244, and fourth optical surface 147, which is further disposed on the light path between light separation part 244 (transmission surface 244C of light separation part 244) and second optical surface 145.

Second transmission part 244B includes transmission surface 244C, which is disposed on the light path between first optical surface 141 and second optical surface 145 and is perpendicular to the light axis of signal light Ls separated by light separation part 244. The perpendicular surface is a surface that is at ±5° or smaller, more preferably at 0° with respect to a line perpendicular to the light axis of signal light Ls separated by light separation part 244. Transmission surface 244C emits, to the outside of optical receptacle 240, signal light Ls separated by light separation part 244.

Fourth optical surface 147 is formed on the top surface side of optical receptacle 240, and is perpendicular to the light axis of signal light Ls separated by light separation part 244. The perpendicular surface is a surface that is at ±5° or smaller, more preferably at 0° with respect to a line perpendicular to the light axis of signal light Ls separated by light separation part 244. Fourth optical surface 147 is disposed on the light path between transmission surface 244C and second optical surface 145. Fourth optical surface 147 allows, to reenter optical receptacle 240, signal light Ls that is separated by light separation part 244 and is emitted to the outside of the optical receptacle 240. With this configuration, it is possible to allow signal light Ls travelling toward end surface 125 of optical transmission member 160 to reenter optical receptacle 140 without refracting the light.

Operation

As illustrated in FIG. 9, in optical module 200 according to the present embodiment, a part of the light entered from first optical surface 141 and reflected by reflection surface 142 passes through first transmission part 143 and becomes signal light Ls travelling toward optical transmission member 160, and the other part (preferably, the remaining part) of the light impinges on light separation part 244. A part of the light that impinges on light separation part 244 is reflected by reflection part 144A and becomes monitor light Lm travelling toward detection element 123, and at least a part of light other than the light reflected by reflection part 144A (preferably, light other than the light reflected by reflection part 144A) passes through second transmission part 244B so as to be emitted from transmission surface 244C to the outside of optical receptacle 240 as signal light Ls travelling toward optical transmission member 160. Signal light Ls emitted from transmission surface 244C reenters optical receptacle 240 from fourth optical surface 147. Then, signal light Ls reentered from fourth optical surface 147 and signal light Ls passed through first transmission part 143 are emitted from second optical surface 145 so as to reach end surface 125 of optical transmission member 160.

As described above, in optical module 200 according to the present embodiment, as the position of light axis LA of the light entered from first optical surface 141 is shifted upward with respect to boundary 148 between first transmission part 143 and second transmission part 244B, the proportion of monitor light Lm with respect to the light at the same height as light axis LA tends to be continuously (gently) increased as in Embodiment 1.

Accordingly, even when the position of the light that impinges on first optical surface 141 is shifted upward with respect to the set position due to positional displacement of light separation part 244 in optical receptacle 240, and the intensity of monitor light Lm tends to be gently increased, the intensity of signal light Ls tends to be gently reduced. Thus, variation in the light split ratio between signal light Ls and monitor light Lm can be suppressed.

Effect

As described above, in optical module 200 according to the present embodiment, even when the position of light separation part 244 in optical receptacle 240 is shifted, variation in the light split ratio between monitor light Lm and signal light Ls can be suppressed as in Embodiment 1. Thus, the required positional accuracy in light separation part 244 in optical receptacle 240 can be eased.

Embodiment 3

Configuration of Optical Module

Optical module 300 according to Embodiment 3 differs from optical module 100 according to Embodiment 1 in that optical receptacle 340 is of a lens array type and can support multichannel light transmission. In the following description, the components similar to those of Embodiment 1 are designated with the same reference numerals, and the description thereof is omitted.

Figure 12:
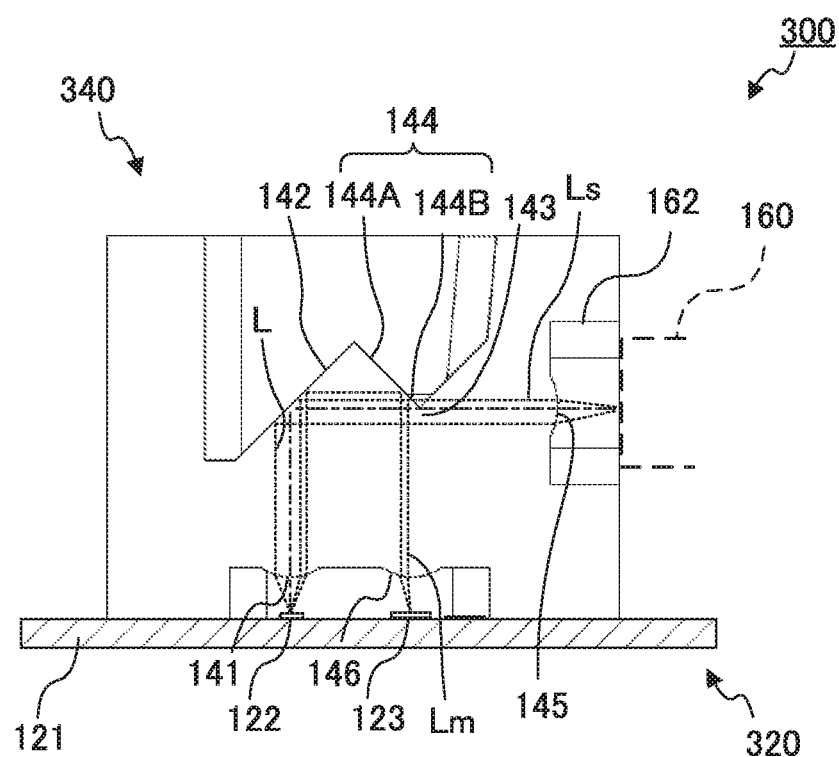
FIG. 12 is a sectional view of an optical module according to Embodiment 3.

FIG. 12 is a sectional view of optical module 300 according to Embodiment 3. As illustrated in FIG. 12, optical module 300 includes optical receptacle 340 and photoelectric conversion device 320 of a substrate mounting type including light emitting element 122.

In optical module 300 according to the present embodiment, optical transmission member 160 is attached to optical receptacle 340 through a publicly known attaching member in the state where optical transmission member 160 is housed in a multicore collective connector. In the present embodiment, four optical transmission members 160 are arranged at a constant interval in one line. Note that optical transmission member 160 may be arranged in two or more lines.

Photoelectric conversion device 320 includes substrate 121, a plurality of light emitting elements 122, and a plurality of detection elements 123. The numbers of light emitting elements 122 and detection elements 123 are not limited as long as a plurality of light emitting elements 122 and a plurality of detection elements 123 are provided. In the present embodiment, four light emitting elements 122 and four detection elements 123 are provided.

Four light emitting elements 122 are arranged in one line on substrate 121. In FIG. 12, four light emitting elements 122 are arranged in one line in the depth direction of the drawing. Four light emitting elements 122 are arranged at a constant interval along the arrangement direction of optical transmission member 160.

Four detection elements 123 are disposed on substrate 121. Four detection elements 123 are arranged in one line at a constant interval in such a manner as to correspond to four light emitting elements 122.

Configuration of Optical Receptacle

Figure 13A:
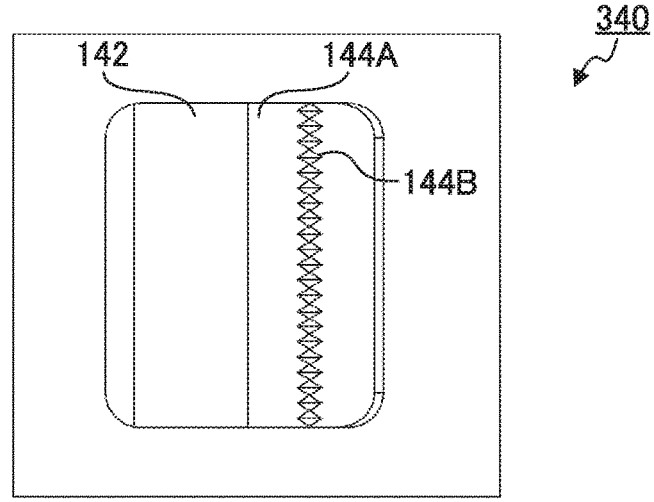
FIGS. 13A to 13C illustrate a configuration of an optical receptacle according to Embodiment 3.
Figure 13B:
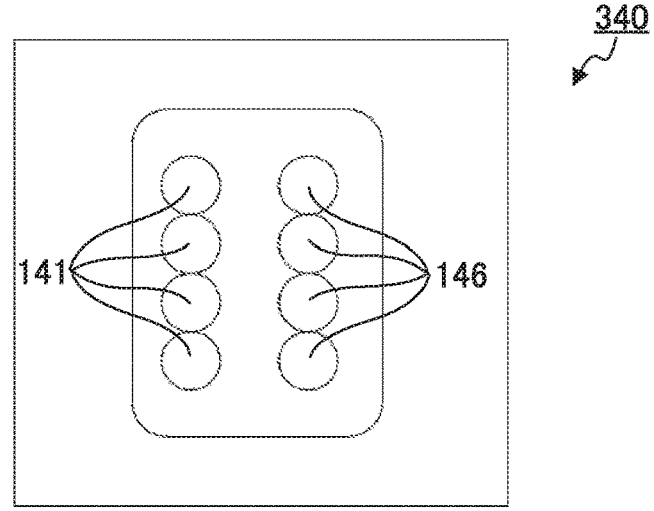
Figure 13C:
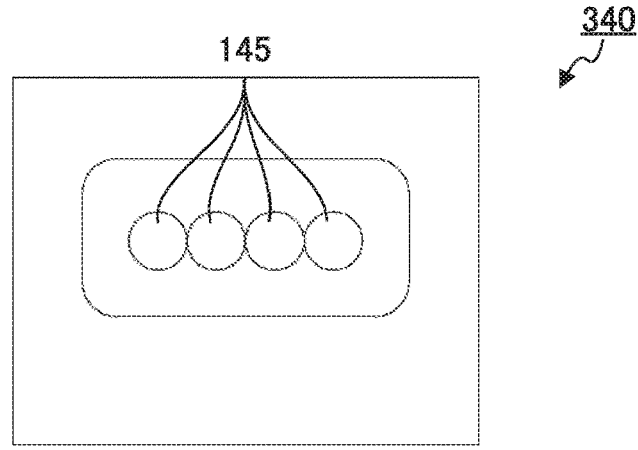

FIGS. 12 to 13C illustrate a configuration of optical receptacle 340 according to the present embodiment. FIG. 13A is a plan view of optical receptacle 340, FIG. 13B is a bottom view of optical receptacle 340, and FIG. 13C is a front view of optical receptacle 340.

As illustrated in FIGS. 13A to 13C, optical receptacle 340 according to the present embodiment includes a plurality of first optical surfaces 141, reflection surface 142, a plurality of first transmission parts 143, a plurality of reflection parts 144A, a plurality of second transmission parts 144B, a plurality of second optical surfaces 145 and a plurality of third optical surfaces 146. In the present embodiment, four first optical surfaces 141, four second optical surfaces 145, four first transmission parts 143, and four third optical surfaces 146 are provided.

Effect

Optical module 300 according to the present embodiment can support multichannel light transmission that involves monitoring while achieving the effect of Embodiment 1.

While second transmission parts 144B and 244B of optical receptacles 140, 240 and 340 have a triangular cross-sectional shape in the cross-section perpendicular to the light axis of the light entered from first optical surface 141 in Embodiments 1 to 3, the present invention is not limited to this.

Figure 14A:
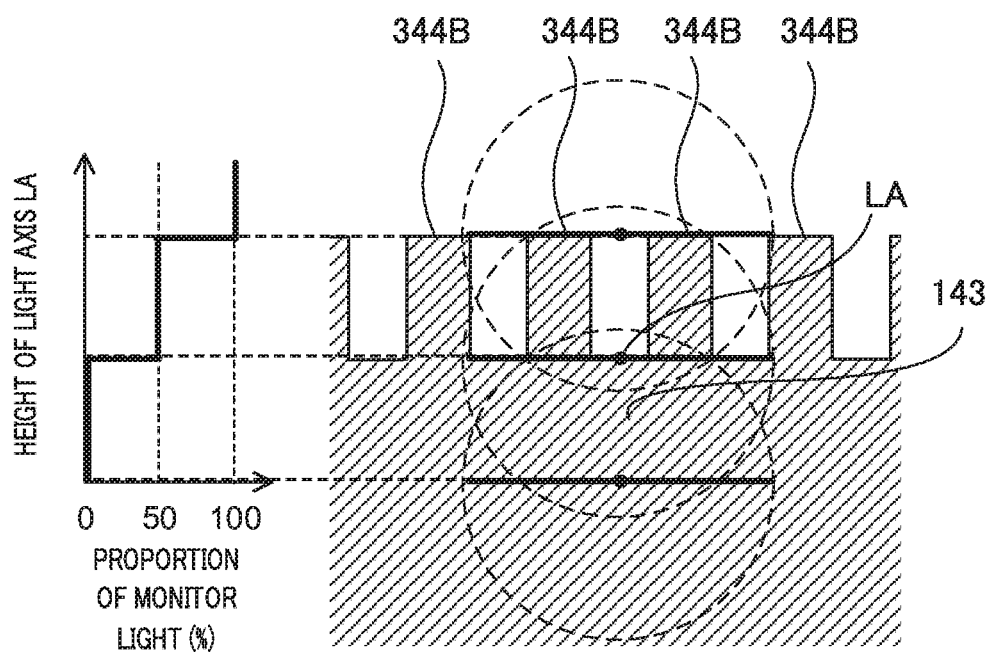
FIGS. 14A and 14B are partially enlarged sectional views illustrating a cross-sectional shape of a second transmission part in a cross-section perpendicular to a light axis of light entered from a first optical surface in an optical receptacle according to a modification.
Figure 14B:
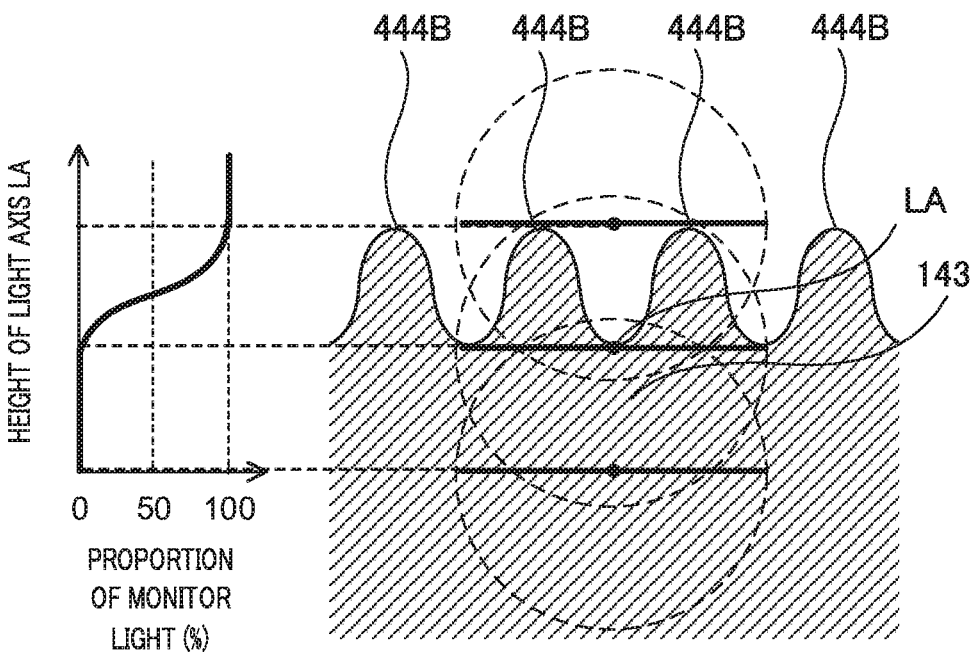

FIGS. 14A and 14B are partially enlarged sectional views illustrating a cross-sectional shape of the second transmission part in the cross-section perpendicular to the light axis of the light entered from first optical surface 141. FIGS. 14A and 14B illustrate a positional relationship between light at the same height as light axis LA of the light entered from first optical surface 141, first transmission part 143 and a plurality of second transmission parts 344B or 444B in the cross-section perpendicular to the light axis of the light entered from first optical surface 141, as in FIG. 8. In addition, the graphs on the left side in FIGS. 14A and 14B illustrate a relationship between the height of light axis LA, and the proportion of light at the same height as light axis LA that becomes monitor light Lm, as in FIG. 8.

As illustrated in FIG. 14A, second transmission part 344B may have a rectangular cross-sectional shape. In FIG. 14A, as the position of light axis LA is shifted upward with respect to the boundary between first transmission part 143 and reflection part 144A, the proportion of monitor light Lm with respect to the light at the same height as light axis LA discontinuously increases from 0% to 100%; however, variation in light split efficiency is gentle since the proportion increases in multiple steps. In addition, as illustrated in FIG. 14B, second transmission part 444B may have a cross-sectional shape with a wavy boundary with the air interface.

In addition, reflection surface 142 is provided in each of optical receptacles 140, 240 and 340 in Embodiments 1 to 3, the present invention is not limited to this.

Figure 15:
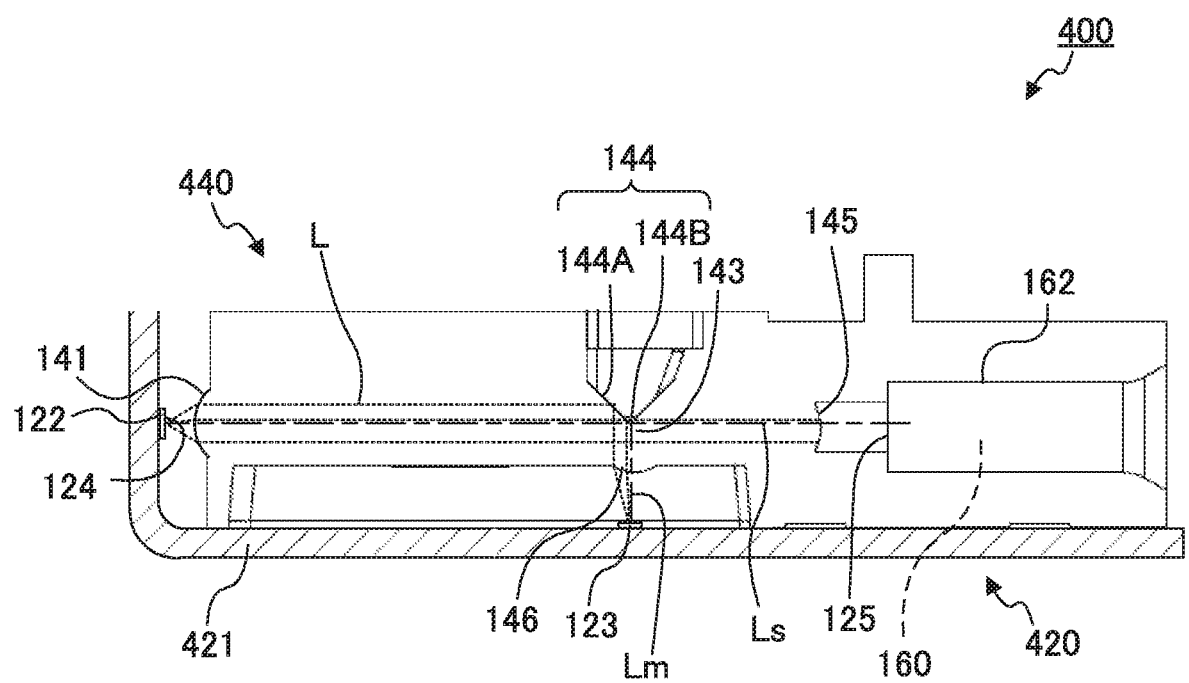
FIG. 15 is a sectional view of an optical module according to a modification.

FIG. 15 is a sectional view of optical module 400 according to a modification. As illustrated in FIG. 15, optical module 400 includes optical receptacle 440 and a photoelectric conversion device 420 including light emitting element 122. Optical receptacle 440 has the same configuration as that of optical receptacle 140 of FIG. 1 except that first optical surface 141 is disposed in the back surface of optical receptacle 440 and that reflection surface 142 is not provided. Substrate 421 of photoelectric conversion device 420 is disposed such that light emitting element 122 faces first optical surface 141 of optical receptacle 440 and that detection element 123 faces third optical surface 146.

In addition, while reflection surface 142 and reflection part 144A are not in contact with each other on the top surface side of optical receptacles 140, 240 and 340 in Embodiments 1 to 3, the present invention is not limited to this, and reflection surface 142 and reflection part 144A may be in contact with each other.

In addition, while each of first optical surface 141, second optical surface 145 and third optical surface 146 is a convex lens surface in optical receptacles 140, 240 and 340 in Embodiments 1 to 3, the present invention is not limited to this, and each surface may be a flat surface. In addition, while each of first optical surface 141, second optical surface 145 and third optical surface 146 has a circular shape in plan view in the above-mentioned examples, the present invention is not limited to this.

In addition, while each of four first optical surfaces 141 is used as transmission first optical surface 141 (optical module 300 is used as a transmission optical module) in FIGS. 13A and 13B in Embodiment 3, the present invention is not limited to this. For example, each of four first optical surfaces 141 may be used as a reception first optical surface 141 (optical module 300 may be used as a reception optical module), or two first optical surfaces 141 on the right or left side may be used as reception first optical surfaces 141 (optical module 300 may be used as a transmission and reception optical module).

In addition, while the surface facing reflection part 144A with the plurality of second transmission parts 144B therebetween is an inclined surface in Embodiments 1 and 3, the present invention is not limited to this, and the surface may be a surface that is perpendicular to the light axis of signal light Ls separated by light separation part 144. The perpendicular surface is a surface that is at ±5° or smaller, more preferably at 0° with respect to a line perpendicular to the light axis of signal light Ls separated by light separation part 144.

This application is entitled to and claims the benefit of Japanese Patent Application No. 2017-174145 filed on Sep. 11, 2017, the disclosure each of which including the specification, drawings and abstract is incorporated herein by reference in its entirety.

INDUSTRIAL APPLICABILITY

The optical receptacle and the optical module according to the embodiment of the present invention are suitable for optical communications using an optical transmission member.

REFERENCE SIGNS LIST 100, 200, 300, 400 Optical module
120, 320, 420 Photoelectric conversion device
121, 421 Substrate
122 Light emitting element
123 Detection element
124 Light emitting surface
125 End surface
140, 240, 340, 440 Optical receptacle
141 First optical surface
142 Reflection surface
143 First transmission part
144, 244 Light separation part
144A Reflection part
144B, 244B, 344B, 444B Second transmission part
145 Second optical surface
146 Third optical surface
147 Fourth optical surface
148 Boundary
149 Valley part
160 Optical transmission member
162 Ferrule
244C Transmission surface
L Emission light
Lm Monitor light
Ls Signal light
A Optical effective region
Rmax Radius
LA Light axis

The invention claimed is:

1. An optical receptacle configured to optically couple a light emitting element and an end surface of an optical transmission member when the optical receptacle is disposed between an optical transmission member and a photoelectric conversion device including the light emitting element and a detection element configured to monitor emission light emitted from the light emitting element, the optical receptacle comprising:
a first optical surface configured to allow incidence of the light emitted from the light emitting element;
a first transmission part configured to allow, to pass through the first transmission part as signal light travelling toward the end surface of the optical transmission member, a part of light entered from the first optical surface;
a light separation part configured to separate another part of the light entered from the first optical surface into monitor light travelling toward the detection element and the signal light travelling toward the end surface of the optical transmission member;
a second optical surface configured to emit, toward the end surface of the optical transmission member, the signal light passed through the first transmission part and the signal light separated by the light separation part; and
a third optical surface configured to emit, toward the detection element, the monitor light separated by the light separation part,
wherein the light separation part includes
a reflection part inclined with respect to a light axis of the light entered from the first optical surface, the reflection part being configured to reflect, toward the third optical surface as the monitor light, a part of light incident on the light separation part,
a plurality of second transmission parts disposed between the reflection part and the first transmission part, the plurality of second transmission parts being configured to allow, to pass through the plurality of second transmission parts as signal light, another part of the light incident on the light separation part, and
the first transmission part and two or more second transmission parts of the plurality of second transmission parts are located within an optical effective region that is a region around a central axis, the central axis being set as a light axis of light that is entered from the first optical surface and is emitted from the second optical surface, the optical effective region having a periphery that is a surface separated from the central axis by a distance equal to one of a radius of the first optical surface and a radius of the second optical surface, the one of the radius of the first optical surface and the radius of the second optical surface being larger than the other.

2. The optical receptacle according to claim 1, wherein the plurality of second transmission parts is in contact with the first transmission part.

3. The optical receptacle according to claim 1, wherein in a cross-section perpendicular to a light axis of the light entered from the first optical surface, a width of each of the plurality of second transmission parts increases toward the first transmission part.

4. The optical receptacle according to claim 1, wherein the signal light passed through the second transmission part is emitted to outside of the optical receptacle for a first time from the second optical surface.

5. The optical receptacle according to claim 1,
wherein the second transmission part further includes a transmission surface disposed on a light path between the first optical surface and the second optical surface, the transmission surface being perpendicular to a light axis of the signal light separated by the light separation part; and wherein the optical receptacle further includes a fourth optical surface disposed on a light path between the transmission surface and the second optical surface, the fourth optical surface being configured to allow, to reenter the optical receptacle, the signal light emitted to the outside of the optical receptacle from the transmission surface.

6. The optical receptacle according to claim 1, further comprising a reflection surface disposed on a light path between the first optical surface and the first transmission part, and a light path between the first optical surface and the light separation part, the reflection surface being configured to reflect, toward the first transmission part and the light separation part, the light entered from the first optical surface.

7. An optical module comprising:
a photoelectric conversion device including a substrate, a light emitting element disposed on the substrate, and a detection element disposed on the substrate and configured to monitor emission light emitted from the light emitting element;
the optical receptacle according to claim 1; and
the first transmission part and two or more second transmission parts of the plurality of second transmission parts are located within a light flux of light that is emitted from the light emitting element and is entered from the first optical surface.

* * * * *